(12) United States Patent
Ahlgren et al.

(10) Patent No.: US 7,838,132 B2
(45) Date of Patent: Nov. 23, 2010

(54) PVD-COATED CUTTING TOOL INSERT

(75) Inventors: Mats Ahlgren, Täby (SE); Helen Blomqvist, Stockholm (SE)

(73) Assignee: Sandvik Intellectual Property AB, Sandviken (SE)

( * ) Notice: Subject to any disclaimer, the term of this patent is extended or adjusted under 35 U.S.C. 154(b) by 257 days.

(21) Appl. No.: 10/577,459

(22) PCT Filed: Sep. 9, 2005

(86) PCT No.: PCT/SE2005/001311

§ 371 (c)(1), (2), (4) Date: May 21, 2008

(87) PCT Pub. No.: WO2006/041367

PCT Pub. Date: Apr. 20, 2006

(65) Prior Publication Data

US 2008/0273933 A1  Nov. 6, 2008

(30) Foreign Application Priority Data

Sep. 10, 2004 (SE) .................................. 0402179
Feb. 21, 2005 (SE) .................................. 0500393

(51) Int. Cl.
*B32B 9/00* (2006.01)
*C23C 14/06* (2006.01)

(52) U.S. Cl. ........................ 428/697; 51/307; 51/309; 204/192.1; 204/192.15; 204/192.16; 428/336; 428/698; 428/699

(58) Field of Classification Search ............. 51/307, 51/309; 428/336, 697, 698, 699, 1, 702, 428/704; 204/192, 192.15, 192.16, 192.1
See application file for complete search history.

(56) References Cited

U.S. PATENT DOCUMENTS 6,071,560 A * 6/2000 Braendle et al. ....... 204/192.38

(Continued)

FOREIGN PATENT DOCUMENTS

JP  4-300104  10/1992

(Continued)

OTHER PUBLICATIONS

Weber et al "Cathodic arc evaporation of (Ti,Al)N coatings and (Ti,Al)N/TiN multilayered coatings- correlation between lifetime of coated cutting tools, structural and mechanical film properties" Surf. and Coat. Tech 177-178 (2004) 227-232.*

(Continued)

*Primary Examiner*—Archene Turner
(74) *Attorney, Agent, or Firm*—Drinker Biddle & Reath LLP

(57) ABSTRACT

The present invention relates to a coated cutting tool insert of cemented carbide with coating including at least one layer of $Ti_{1-x}Al_xN$ deposited by PVD-technique. The layer has x=0.4-0.6 with a compressive residual stress of >4-6 GPa and a thickness of 1.5-5, preferably 2.5-4 µm. Both the I(111) and I(200) are <7.5, preferably <5, times, the intensity average noise level. Good adhesion despite high compressive stress is obtained if the layer is deposited by cathodic arc evaporation technique at a bias in the range $-90<U<-50V$, preferably $-80V<U<-60V$.

6 Claims, 2 Drawing Sheets

U.S. PATENT DOCUMENTS

| | | | |
|---|---|---|---|
| 6,395,379 B1 * | 5/2002 | Braendle | 428/697 |
| 6,565,957 B2 * | 5/2003 | Nakamura et al. | 428/216 |
| 6,824,601 B2 * | 11/2004 | Yamamoto et al. | 428/699 |
| 7,524,569 B2 * | 4/2009 | Okamura et al. | 428/698 |
| 2002/0051885 A1 | 5/2002 | Braendle et al. | |

FOREIGN PATENT DOCUMENTS

| | | |
|---|---|---|
| JP | 5-177413 | 7/1993 |
| JP | 7-188901 | 7/1995 |
| JP | 8-209334 | 8/1996 |
| JP | 08-209335 | 8/1996 |
| JP | 09/095763 | 4/1997 |
| JP | 09-323205 * | 12/1997 |
| JP | 10/140330 | 5/1998 |
| JP | 2002-003284 * | 1/2002 |

OTHER PUBLICATIONS

I.C. Noyan, J. B. Cohen; "5 Determination of Strain and Stress Fields by Diffraction Methods"; Residual Stress Management by Diffraction and Interpretation; Springer-Verlag; New York; 1987; pp. 117-130.

International Search Report Dec. 20, 2005 in International Application No. PCT/SE2005/001311.

* cited by examiner

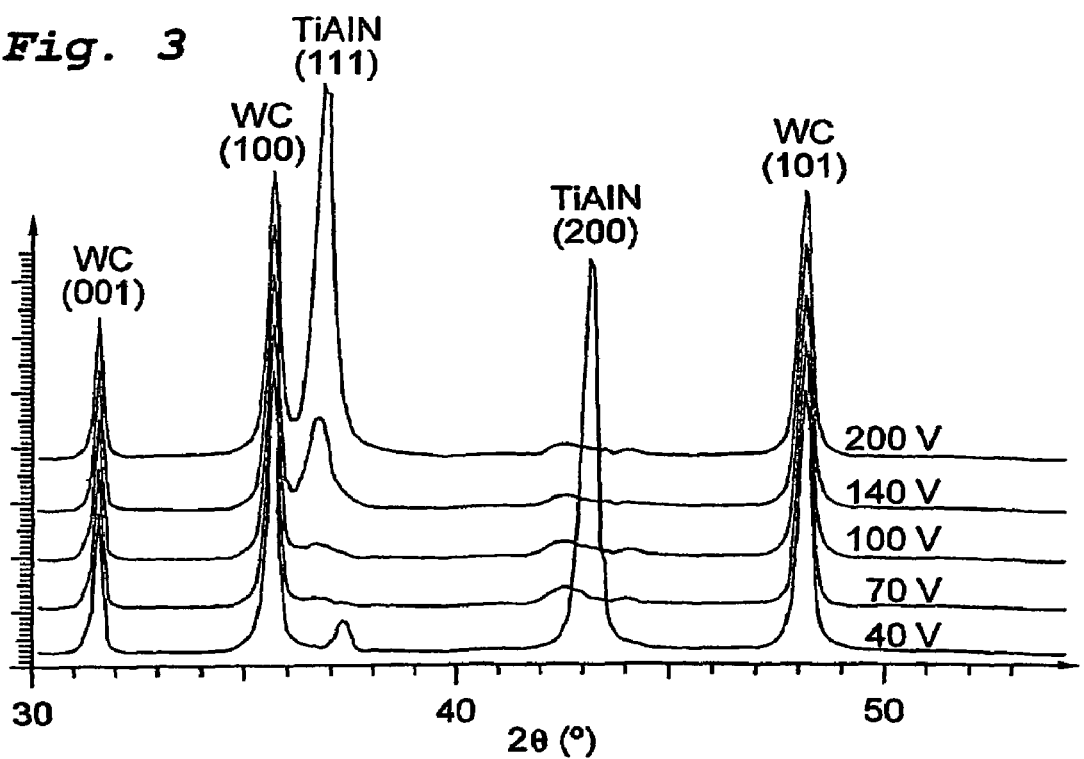
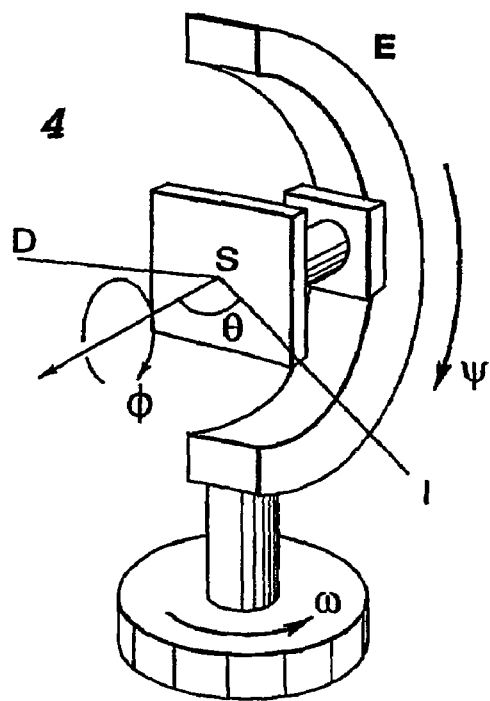

PVD-COATED CUTTING TOOL INSERT

The present invention relates to a PVD coated cutting insert suitable for machining of metals by turning, milling, drilling or by similar chip forming machining methods. The invented coated insert shows maintained adhesion despite a relatively high compressive stress state of the (Ti,Al)N-layer.

Modern high productivity chip forming machining of metals requires reliable tools with high wear resistance, good toughness properties and excellent resistance to plastic deformation.

This has so far been achieved by employing a cemented carbide tool body coated with a wear resistant coating. The cemented carbide tool body is generally in the shape of an indexable insert clamed in a tool holder, but can also be in the form of a solid carbide drill or a milling cutter.

Cemented carbide cutting tools coated with various types of hard layers like TiC, Ti(C,N), TiN, $TiC_xN_yO_z$ and $Al_2O_3$ have been commercially available for many years. Such tool coatings are generally built up by several hard layers in a multilayer structure. The sequence and the thickness of the individual layers are carefully chosen to suit different cutting application areas and work-piece materials.

Tool coatings are most frequently deposited by using Chemical Vapour Deposition (CVD) or Physical Vapour Deposition (PVD) techniques. In some rare cases also Plasma Assisted Chemical Vapour Deposition (PACVD) has been practised.

The CVD-technique is often preferred over PVD as it has several advantages. It allows larger coating batches, produces coatings with good coating thickness distribution on complex shaped tools, has a high throwing power, can be used to deposit electrical non-conducting layers like $Al_2O_3$ and $ZrO_2$ and many different materials can be deposited in the same coating run like e g $Al_2O_3$, TiC, Ti(C,N), TiN, $TiC_xN_yO_z$, Zr(C,N) and $ZrO_2$.

The CVD technique is conducted at a rather high temperature range, 950-1050° C. Due to this high deposition temperature and to a mismatch in thermal coefficients of expansion between the deposited coating materials and the cemented carbide, CVD produces layers with cooling cracks and tensile stresses.

PVD processes run at a significantly lower temperature, 450-650° C. and are performed under strong ion bombardment which leads to crack free layers with high compressive stresses. The high compressive stresses and the absence of cooling cracks makes PVD coated tools much tougher than CVD-coated tools and are therefore often preferred in interrupted cutting operations like in milling. The cathodic arc evaporation method is a successful physical vapour deposition (PVD) technique. It offers possibilities to deposit a wide range of materials with high deposition rate and good adhesion to the substrate. In the cathodic arc evaporation deposition process material is evaporated from the target with a vacuum arc. The basic principles are illustrated in FIG. 1. The basic components consists of a vacuum chamber, a cathode and an arc power supply, a means of igniting an arc on the cathode surface, an anode and a substrate bias power supply. Arcing is initiated by applying a high bias and/or by mechanical ignition. The evaporation is the result of the arc spot which moves randomly over the target source and melts/evaporates material. The material moves towards the substrates and forms a layer. The properties of this layer is influenced by e.g. the gases in the chamber and applied substrate bias.

The high levels of residual stress in PVD layers can have the beneficial effect of increasing the wear resistance and the hardness, but may on the other hand reduce the adhesion. The stresses may tend to push off the layer at the cutting edgeline curvature. Therefore high compressive stresses are avoided in PVD-layers. In JP-A-08-209334 the residual compressive stress of the (Ti,Al)N layer is reduced from about 3 GPa to 1.5-2 GPa and adhesion is improved as compared with the conventional (Ti,Al)N by adding low-hardness elements Co, Ni or Fe and allowing them to enter into solid solution. JP-A-07-188901 is similar. JP-A-05-177413 discloses a compressive stress of 0.2-2.0 GPa. JP-A-04-300104 discloses adjusting the residual tensile and compressive stresses in layer to below 0.1 GPa by a treatment such as sand blasting, etc. JP-A-10-140330 improves the adhesion of a layer by interposing a relatively soft layer under the layer having high compressive stress such as (Ti,Al)N-layer thus absorbing and relaxing the high compressive stress of the layer. US-A-2002/0051885 discloses a tool with a tool body and a wear resistant layer system, which layer system comprises at least one layer of MeX. Me comprises titanium and aluminium and X is nitrogen or carbon. The tool has a tool body of high speed steel (HSS) or of cemented carbide. In the MeX layer the quotient $Q_I$ as defined by the ratio of the diffraction intensity I(200) to I(111) assigned respectively to the (200) and (111) planes in the X-ray diffraction of the material using θ-2θ-method is selected to be >1. Further, the I(200) is at least twenty times larger than the intensity average noise value, both measured with a well-defined equipment and setting thereof.

It is an object of the present invention to provide a (Ti,Al)N coated cutting tool insert with relatively high compressive stress and maintained adhesion.

FIG. 3 shows X-ray diffraction patterns, intensity(I) versus diffraction angle (2θ), of the (Ti,Al)N layers deposited at substrate bias between −40 and −200 V.

Figure 1:
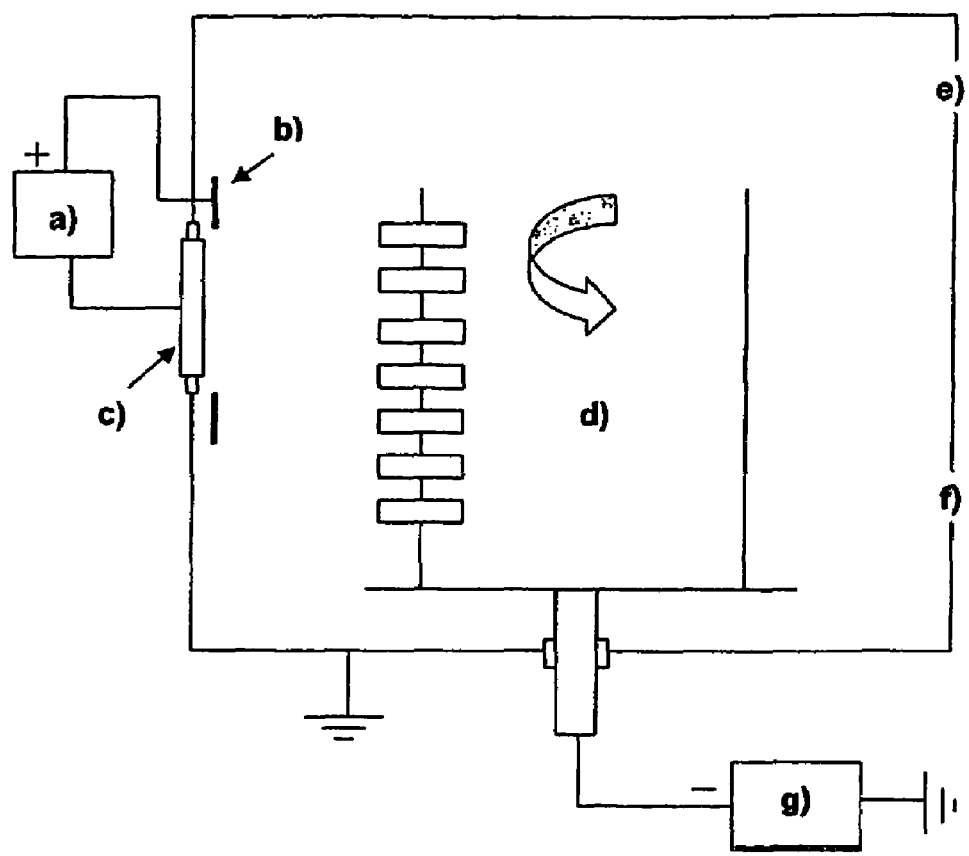
FIG. 1 shows the basic principles of the arc evaporation technique in which
a)=Arc supply
b)=Anode
c)=Arc source
d)=Substrate table
e)=Gas inlet
f)=Vacuum pumps
g)=Bias supply
Figure 2:
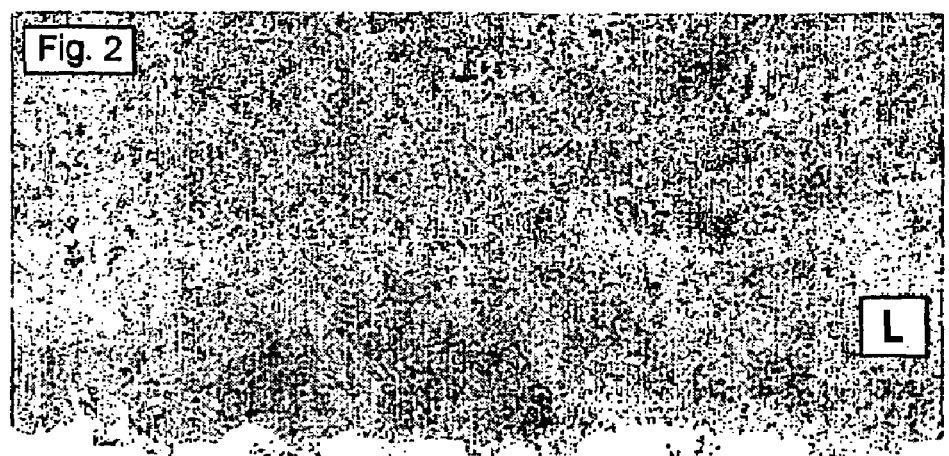
FIG. 2 shows a SEM-image of the (Ti,Al)N-layer on the clearance side of the insert deposited at bias=−70 V in which
S=substrate and
L=layer.

FIG. 4 shows the goniometer setup
E=Euler ¼-cradle
S=sample
I=incident X-ray beam
D=diffracted X-ray beam
θ=diffraction angle
ω=θ
ψ=tilt angle along the Euler ¼-cradle
Φ=rotation angle around the sample axis According to the present invention there is provided a coated cutting tool insert for metal machining such as turning, milling and drilling comprising a body of cemented carbide onto which a hard and wear resistant refractory coating is deposited by PVD technique. The wear resistant coating is composed of one or more layers of refractory compounds of which at least one layer consists of $Ti_{1-x}Al_xN$ deposited by PVD-technique and that the other layer(s), if any at all, comprise(s) wear resistant nitrides, carbides and/or carbonitrides as known in the art. The (Ti,Al)N-layer has a composition of $Ti_{1-x}Al_xN$ with x=0.4-0.6 and a compressive stress of >4-6 GPa at a thickness of 1.5-5, preferably 2.5-4, μm. The layer is of a glassy type (FIG. 2) with no pronounced diffraction peaks (FIG. 3). Both the intensities of the (111) and (200) reflections, I(111) and I(200) respectively, should be <7.5, preferably <5, times the intensity average noise value (150 counts). The average noise value shall be included in the values of I(111) and I(200) and measured with a Bragg-Brentano diffractometer, Siemens D5000 with $CuK_\alpha$ radiation at an operating voltage of 40 kV and current of 50 mA, a 2θ angular speed of 0.02°/min and a time constant of 1 s.

The residual stress, σ, of the (Ti,Al)N-layer is evaluated by XRD measurements using the well known $sin^2\psi$ method as described by I. C. Noyan, J. B. Cohen, Residual Stress Measurement by Diffraction and Interpretation, Springer-Verlag, New York, 1987 (pp 117-130). The measurements shall be performed using $CuK_\alpha$-radiation on the (Ti,Al)N 200-reflection. The goniometer setup is shown i FIG. 4. It is recommended to use the side-inclination technique (ψ-geometry) with six to eleven, preferably eight, ψ-angles, equidistant within a $sin^2\psi$-range of 0 to 0.5 (ψ=45°). An equidistant distribution of Φ-angles within a Φ-sector of 90° is preferred. To confirm a biaxial stress state the sample shall be rotated for Φ=0° and 90° while tilted in ψ. It is recommended to investigate the possible presence of shear stresses and therefore both negative and positive ψ-angles shall be measured. In the case of an Euler ¼-cradle this is accomplished by measuring the sample also at Φ=180° and 270° for the different ψ-angles. The measurement shall be performed on an as flat surface as possible, preferably on a clearance side of an insert. For the calculations of the residual stress values the Possion's ratio, v=0.20 and the Young's modulus, E=450 GPa are to be used. Alternatively, Young's modulus, E, can be determined e.g. by nano-indentation technique. Preferably the data are evaluated using commercially available software such as DIFFRAC$^{Plus}$ Stress32 v. 1.04 from Bruker AXS preferably locating the (200) reflection by the Pseudo-Voigt-Fit function. In case of a biaxial stress state the total stress is calculated as the average of the obtained biaxial stresses.

According to the method of the present invention the (Ti,Al)N coated cutting tool inserts with high compressive stress and still good adhesion are obtained if the layers are deposited by cathodic arc evaporation technique at a bias of −70 V.

Preferably said layer is deposited with a bias, U, in the range −90<U<−50V, preferably −80<U<−60V; with a nitrogen pressure in the range of 20-40 μbar; arc current in the range 160-220 A and temperature in the range 400-600° C.

EXAMPLE 1

Cemented carbide cutting inserts of geometry CNMG120408-MM with the composition 10 wt-% Co and as rest WC were coated with an about 3 μm layer of (Ti,Al)N using arc evaporation technique in a Balzers Rapid Coating System (RCS) equipment with a target composition of Ti50Al50 (at-%) in a nitrogen atmosphere at the following process conditions.

Temperature: 450° C.
Pressure: 32 μbar
Arc current: 200 A
Substrate bias, U: −40, −70, −100, −140 and −200 V The composition of the (Ti,Al)N-layers was estimated by electron probe microanalysis (EPMA) with an analysis area of 0.5-1 μm using a Jeol JXA 8900 R at 15 kV.

Structure of the layers were analyzed using a Hitachi S-4300 FEG-SEM at 15 kV.

Hardness and Young's modulus of the layers were evaluated from nano-indentation measurements made on a CSEM nano-hardness tester. The data were obtained for a load of 50 mN. The depths of all indents were less than 10% of the layer thickness.

Texture, residual stress and phases present in the layers were evaluated by XRD measurements. The equipment used for phase and texture analysis was a Bragg-Brentano diffractometer, Siemens D5000 with $CuK_\alpha$ radiation at on operating voltage of 40 kV and current of 50 mA. The 2θ angular speed was 0.02°/min and the time constant was 1 s. The residual stress was evaluated using ψ-geometry on a X-ray diffractometer Bruker D8 Discover-GADDS equipped with laser-video positioning, Euler ¼-cradle, rotating anode as X-ray source ($CuK_\alpha$-radiation) and an area detector (Hi-star). A collimator of size 0.8 mm was used to focus the beam on to the clearance side of the insert. The analysis was performed on the (Ti,Al)N (200) reflection using the goniometer settings 2θ=50°, ω=25° and Φ=0°, 90°, 180°, 270°. Eight ψ tilts between 0° and 70° were performed for each Φ-angle. The $sin^2\psi$ method was used to evaluate the data using the software DIFFRAC$^{Plus}$ Stress32 v. 1.04 from Bruker AXS. The (200) reflection was located using the Pseudo-Voigt-Fit function. The residual stress values were calculated using a Poisson's ratio of v=0.20 and values of Young's modulus, E, determined with the nano-indentation technique for each layer (given in the table). For the 200 V layer, E=450 GPa was used as no nano-indentation data could be collected due to spontaneous spalling. A biaxial stress state was confirmed and the total compressive stress was calculated as the average of the obtained biaxial stresses.

Spalling resistance of the layers was evaluated by an edge line delamination test in wet turning of a Sanmac 304L stainless steel. The cutting speed was 200 m/min, the feed rate 0.3 mm/rev and the depth of cut 3 mm. The results are summarised in the Table.

TABLE

| Layer, Negative substrate bias, −U (V) | Thickness (μm) | I (111) (counts) * | I (200) (counts) * | Young's Modulus (GPa) | Hardness (GPa) | Composition (atom-%) Ti | Composition (atom-%) Al | Residual stress, σ (GPa) | Edge delamination |
|---|---|---|---|---|---|---|---|---|---|
| 40 | 3.2 | 678 | 6008 | 493 | 33.8 | 26.6 | 23.6 | −1.7 | None |
| 70 | 3.0 | 382 | 625 | 445 | 37.0 | 25.8 | 23.3 | −4.4 | None |
| 100 | 3.0 | 423 | 394 | 454 | 35.9 | 26.0 | 23.1 | −5.1 | 100% |
| 140 | 1.6 | 1831 | 356 | 446 | 36.2 | 26.9 | 23.1 | −5.1 | 100% |
| 200 | 1.8 | 6216 | 353 | ** | ** | 27.0 | 24.0 | −5.6 | ** |

* Including the intensity average noise level (150 counts).
** No data could be collected due to spontaneous delamination.

The invention claimed is:

1. A coated cutting tool insert of cemented carbide with a coating including at least one layer of $Ti_{1-x}Al_xN$ deposited by PVD-technique wherein x=0.4-0.6 with a compressive residual stress of >4-6 GPa and a thickness of 1.5-5 µm, and wherein both the intensities of the (111) and (200) reflections, I(111) and I(200), are <7.5 times the intensity average noise level.

2. Method of making a coated cutting tool insert of cemented carbide with a coating including at least one layer of $Ti_{1-x}Al_xN$ deposited by PVD-technique comprising depositing the layer with a bias, U, in a range −90<U<−50V with a nitrogen pressure in the range of 20-40 µbar; an arc current in a range of 160-220 A and a temperature in a range of 400-600° C.

3. The method of claim 2, wherein the bias, U, is in a range −80V<U<−60V.

4. The coated cutting tool insert of claim 1, wherein the thickness is 2.5-4 µm.

5. The coated cutting tool insert of claim 4, wherein both the intensities of the (111) and (200) reflections, I(111) and I(200), are less than five times the intensity average noise level.

6. The coated cutting tool insert of claim 1, wherein both the intensities of the (111) and (200) reflections, I(111) and I(200), are less than five times the intensity average noise level.

* * * * *